(12) United States Patent
Osanai

(10) Patent No.: US 6,972,232 B2
(45) Date of Patent: Dec. 6, 2005

(54) METHOD OF MANUFACTURING A SEMICONDUCTOR DEVICE

(75) Inventor: Jun Osanai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/902,353

(22) Filed: Jul. 29, 2004

(65) Prior Publication Data

US 2005/0037559 A1 Feb. 17, 2005

(30) Foreign Application Priority Data

Aug. 1, 2003 (JP) .............................. 2003-205280

(51) Int. Cl.[7] .......................................... H01L 21/336
(52) U.S. Cl. ...................... 438/270; 438/272; 438/532; 438/589
(58) Field of Search ............................ 438/270, 272, 438/527, 532, 589

(56) References Cited

U.S. PATENT DOCUMENTS

| | | | | |
|---|---|---|---|---|
| 5,132,238 A | * | 7/1992 | Murakami et al. | 438/274 |
| 6,133,099 A | * | 10/2000 | Sawada | 438/270 |
| 6,674,124 B2 | * | 1/2004 | Hshieh et al. | 257/330 |
| 6,737,323 B2 | * | 5/2004 | Mo | 438/270 |

* cited by examiner

Primary Examiner—Trung Dang
(74) Attorney, Agent, or Firm—Adams & Wilks

(57) ABSTRACT

There is provided a method of manufacturing a high quality P-channel trench MOSFET which stably operates. In the method of manufacturing a P-channel trench MOSFET having a P-type gate electrode, the process in which $BF_2$ ions are implanted into a polycrystalline silicon film and thereafter the heat treatment is carried out is performed plural times to thereby form the gate electrode, and it is possible to provide the P-channel trench MOSFET of high quality which stably operates.

4 Claims, 3 Drawing Sheets

METHOD OF MANUFACTURING A SEMICONDUCTOR DEVICE

BACKGROUND OF THE INVENTION

1. Field of the Invention

The present invention relates to a method of manufacturing a high quality P-channel trench MOSFET which stably operates.

2. Description of the Related Art

In order to decrease threshold voltage in a P-channel trench MOSFET, conductivity type of gate electrode needs to be made P-type. Gate electrode is, in general, formed by doped Chemical Vapor Deposition (CVD) in which impurity is simultaneously introduced during polycrystalline silicon film deposition (refer to JP 2002-16080 A (FIG. 5), for example).

In the above-mentioned conventional manufacturing method, the controllability for the quantity of impurity is lower in accuracy than that in an ion implantation method. Following problem thus occurs. Boron ions as a P-type dopant reach the inside of a semiconductor substrate in subsequent heat treatment to make threshold voltage of a MOSFET shift when the quantity of introduced impurity is large, and the resistance of the gate electrode becomes large when the quantity of introduced impurity is small.

SUMMARY OF THE INVENTION

It is an object of the present invention to provide a method of manufacturing a P-channel trench MOSFET of high quality which has stable characteristics.

In order to achieve the above-mentioned object, according to an aspect of the present invention, there is provided a method of manufacturing a P-channel MOSFET, including: forming a trench within an N-type semiconductor substrate; forming a gate oxide film on an inner surface of the trench; depositing a first polycrystalline silicon film on the semiconductor substrate; implanting $BF_2$ ions into the first polycrystalline silicon film by utilizing an ion implantation method and carrying out a first heat treatment; depositing a second polycrystalline silicon film on the first polycrystalline silicon film; implanting $BF_2$ ions into the second polycrystalline silicon film by utilizing the ion implantation method and carrying out a second heat treatment; depositing a third polycrystalline silicon on the second polycrystalline silicon film; and implanting $BF_2$ ions into the third polycrystalline silicon film by utilizing the ion implantation method and carrying out a third heat treatment.

According to another aspect of the present invention, in the method of manufacturing a P-channel MOSFET, a thickness of each of the first, second, and third polycrystalline silicon films is in a range of 300 to 400 nm.

According to still another aspect of the present invention, in the method of manufacturing a P-channel MOSFET, a dose of the $BF_2$ ions implanted into each of the first, second, and third polycrystalline silicon films is in a range of $1 \times 10^{15}$ to $7 \times 10^{15}$ $cm^{-2}$.

According to a further aspect of the present invention, in the method of manufacturing a P-channel MOSFET, each of the first, second, and third heat treatments is carried out at a temperature of 800 to 900 C.

DESCRIPTION OF THE PREFERRED EMBODIMENTS

A method of manufacturing a semiconductor device according to an embodiment of the preset invention will hereinafter be described in detail with reference to the accompanying drawings. FIGS. 1 to 4 show a method of manufacturing a semiconductor device according to an embodiment of the preset invention.

Figure 1:
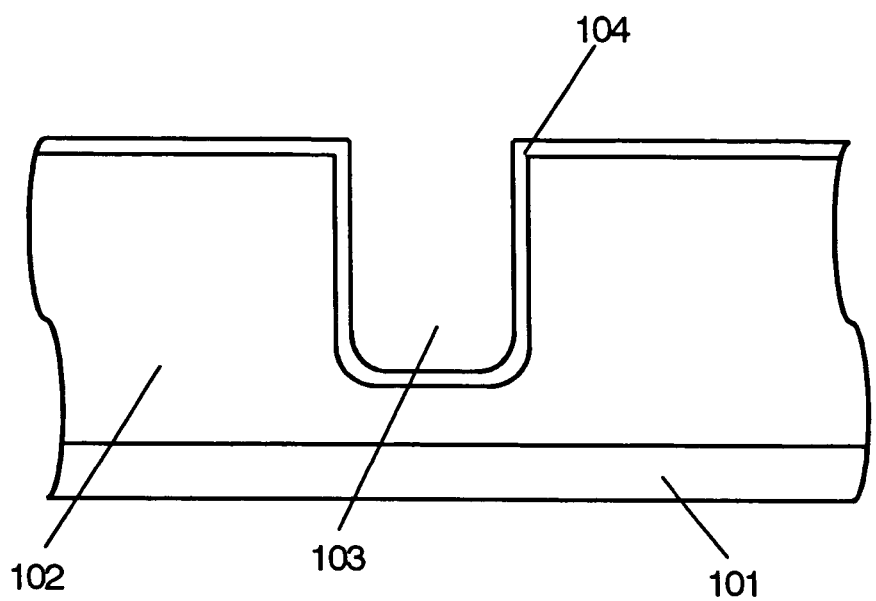
FIG. 1 is a schematic cross sectional view showing a method of manufacturing a semiconductor device according to an embodiment of the present invention.

FIG. 1 shows a schematic cross sectional view in which a low impurity concentrated N-type drift layer 102 is formed on a high impurity concentrated N-type semiconductor substrate 101, a trench 103 is selectively formed within the low impurity concentrated N-type drift layer 102, and a gate insulating film 104 is formed. The trench 103 is formed by utilizing a photolithography method and an anisotropic dry etching process. The gate insulating film 104 is formed by utilizing a thermal oxidation process in a furnace.

Figure 2:
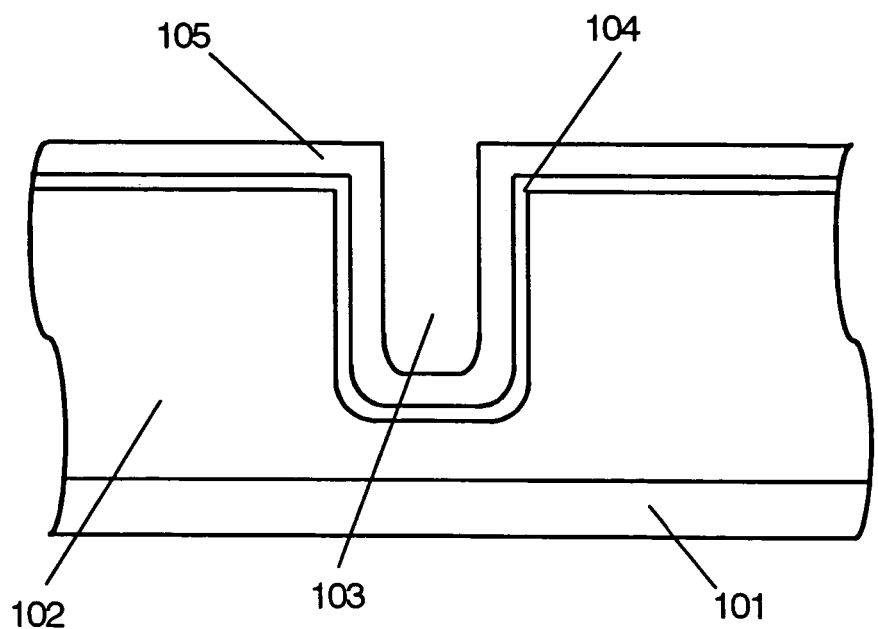
FIG. 2 is a schematic cross sectional view showing the method of manufacturing the semiconductor device according to the embodiment of the present invention.

Next, FIG. 2 shows a schematic cross sectional view in which after a first polycrystalline silicon film 105 is deposited in a thickness of 300 to 400 nm the gate insulating film 104 by utilizing a CVD method, $BF_2$ ions are implanted into the first polycrystalline silicon film 105 at an acceleration energy of 50 keV with a dose of $1 \times 10^{15}$ to $7 \times 10^{15}$ $cm^{-2}$, for example, and heat treatment is then carried out at a temperature of 800 to 900 C for about 30 minutes in an electric furnace. The reason that the thickness of the first polycrystalline silicon film 105 is in a range of 300 to 400 nm is that it is easy to maintain uniformity of the distribution of $BF_2$ ions within the first polycrystalline silicon film 105 through the ion implantation process, and that large stress is prevented from being generated at a time. Also, the reason that the dose of $BF_2$ ions is in the range of $1 \times 10^{15}$ to $7 \times 10^{15}$ $cm^{-2}$ is that a resistance value of the first polycrystalline silicon film 105 can be sufficiently reduced, and a difference in work function can be held large and positive.

When a width of the trench 103 is in a range of 0.5 to 1.0 $\mu$m, to fill the trench 103 with a polycrystalline silicon film, the polycrystalline silicon film must have a thickness of about 1.0 $\mu$m in total. The polycrystalline silicon film is a film having a large stress. If the polycrystalline silicon film is deposited in a thickness of about 1.0 $\mu$m at a time, suitable photolithography process can not be carried out due to the degradation of the gate insulating film 104 and the bending of the semiconductor substrate 101 caused by the stress of the polycrystalline silicon film. For this reason, the polycrystalline silicon film needs to be formed in plural times.

If a second polycrystalline silicon film is formed on the first polycrystalline silicon film 105 without the heat treatment in a case where $BF_2$ ions are used as the dopant for the ion implantation, then fluorine vaporizes in the subsequent heat treatment to generate bubbles in an interface between the first and second polycrystalline silicon films to cause abnormality. In order to avoid such abnormality, the heat treatment should be performed before formation of the second polycrystalline silicon film to thereby carry out the degassing in advance. A temperature in this heat treatment is in a range of 800 to 900 C. If the temperature in this heat treatment is lower than 800 C, the diffusion becomes insufficient due to the low temperature, and if the temperature exceeds 900 C, boron ions penetrates through the gate insulating film 104 to reach the drift layer 102 to cause threshold voltage shift, or the thermal influence exerted on other elements becomes large.

Figure 3:
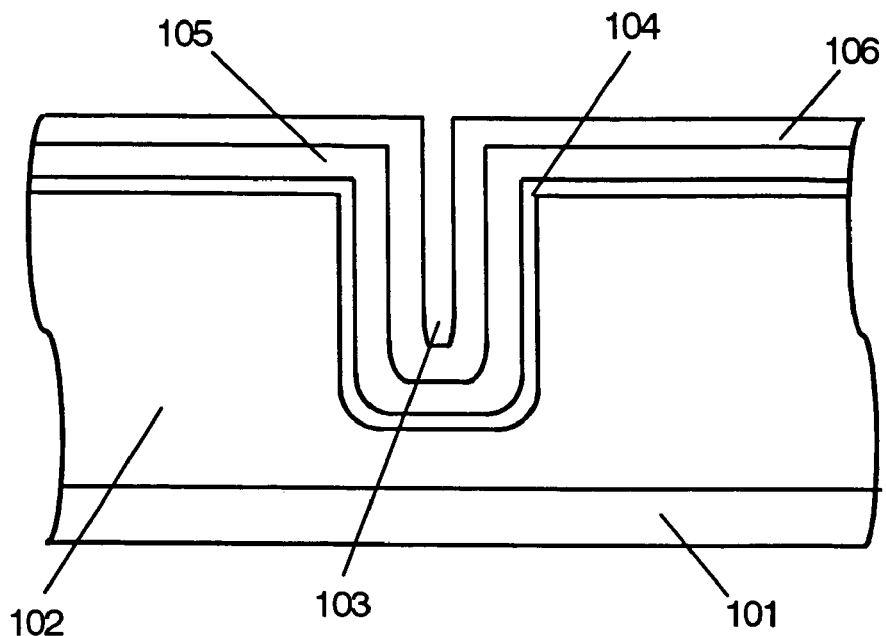
FIG. 3 is a schematic cross sectional view showing the method of manufacturing the semiconductor device according to the embodiment of the present invention.

Next, as shown in FIG. 3, after a second polycrystalline silicon film 106 is deposited in a thickness of 300 to 400 nm, $BF_2$ ions are implanted into the second polycrystalline silicon film 106 with a dose of $1 \times 10^{15}$ to $7 \times 10^{15}$ $cm^{-2}$. Thereafter, the heat treatment is carried out at a temperature of 800 to 900 C.

Figure 4:
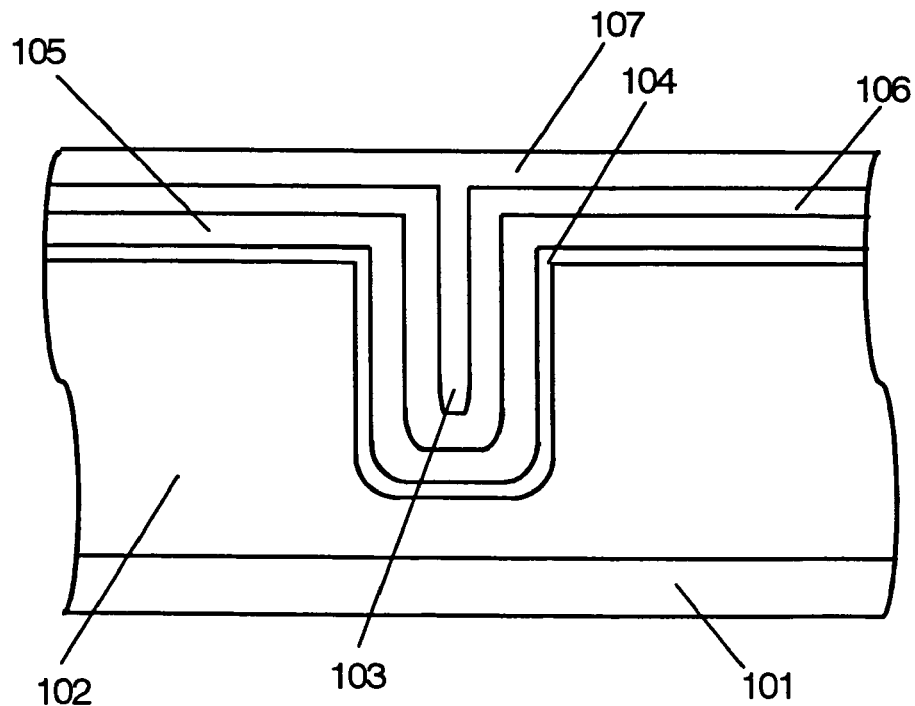
FIG. 4 is a schematic cross sectional view showing the method of manufacturing the semiconductor device according to the embodiment of the present invention.
Figure 5:
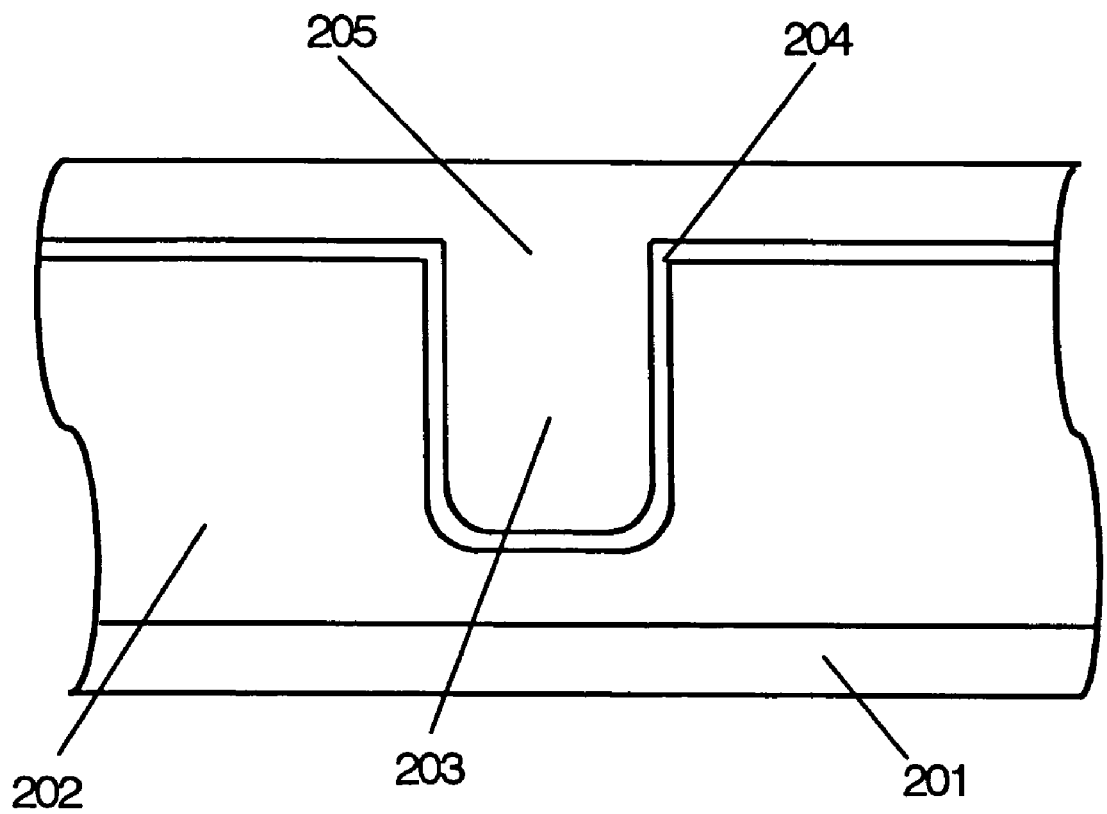
FIG. 5 is a schematic cross sectional view showing a conventional semiconductor device.

Subsequently, to perfectly fill the trench 103 with a polycrystalline silicon film, the processes shown in FIGS. 2 and 3 are repeatedly carried out to obtain a structure shown in FIG. 4.

The subsequent processes are the same as those for manufacturing a normal trench MOSFET. A gate electrode, a body region, and a source region are formed within the semiconductor substrate 101.

By carrying out the above-mentioned processes, the concentration of the impurity in the gate electrode becomes excellent in controllability, and the stress of the polycrystalline silicon film can also be suppressed. Hence, it is possible to obtain a high quality P-channel trench MOSFET which stably operates.

As set forth hereinabove, according to the present invention, in the method of manufacturing the P-channel trench MOSFET having the P-type gate electrode, since the process in which $BF_2$ ions are implanted into the polycrystalline silicon film and thereafter the heat treatment is carried out is performed plural times to thereby form the gate electrode, it is possible to provide the high quality P-channel trench MOSFET which stably operates.

What is claimed is:

1. A method of manufacturing a P-channel MOSFET, comprising:
    forming a trench within an N-type semiconductor substrate;
    forming a gate oxide film on an inner surface of the trench;
    depositing a first polycrystalline silicon film on the semiconductor substrate;
    implanting $BF_2$ ions into the first polycrystalline silicon film by utilizing an ion implantation method and carrying out a first heat treatment;
    depositing a second polycrystalline silicon film on the heated first polycrystalline silicon film;
    implanting $BF_2$ ions into the second polycrystalline silicon film by utilizing the ion implantation method and carrying out a second heat treatment;
    depositing a third polycrystalline silicon on the second polycrystalline silicon film; and
    implanting $BF_2$ ions into the third polycrystalline silicon film by utilizing the ion implantation method and carrying out a third heat treatment.

2. A method of manufacturing a P-channel MOSFET according to claim 1, wherein a thickness of each of the first, second, and third polycrystalline silicon films is in a range of 300 to 400 nm.

3. A method of manufacturing a P-channel MOSFET according to claim 1, wherein a dose of the $BF_2$ ions implanted into each of the first, second, and third polycrystalline silicon films is in a range of $1 \times 10^{15}$ to $7 \times 10^{15}$ $cm^{-2}$.

4. A method of manufacturing a P-channel MOSFET according to claim 1, wherein each of the first, second, and third heat treatments is carried out at a temperature of 800 to 900 C.

* * * * *